(12) United States Patent
Coskun et al.

(10) Patent No.: US 12,372,881 B2
(45) Date of Patent: Jul. 29, 2025

(54) DEEP LEARNING BASED ADAPTIVE ALIGNMENT PRECISION METROLOGY FOR DIGITAL OVERLAY

(71) Applicant: Applied Materials, Inc., Santa Clara, CA (US)

(72) Inventors: Tamer Coskun, San Jose, CA (US); Yen-Shuo Lin, Tainan (TW); Aidyn Kemeldinov, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 312 days.

(21) Appl. No.: 18/034,903

(22) PCT Filed: Nov. 30, 2021

(86) PCT No.: PCT/US2021/061088
§ 371 (c)(1),
(2) Date: May 2, 2023

(87) PCT Pub. No.: WO2022/119796
PCT Pub. Date: Jun. 9, 2022

(65) Prior Publication Data
US 2023/0408932 A1  Dec. 21, 2023

Related U.S. Application Data

(60) Provisional application No. 63/121,129, filed on Dec. 3, 2020.

(51) Int. Cl.
*G03F 7/00* (2006.01)
*G03F 9/00* (2006.01)
(Continued)

(52) U.S. Cl.
CPC ...... *G03F 7/706841* (2023.05); *G03F 9/7092* (2013.01); *G06T 7/001* (2013.01);
(Continued)

(58) Field of Classification Search
CPC ............ G03F 7/706841; G03F 9/7092; G03F 9/7003; G03F 9/7088; G03F 9/7046;
(Continued)

(56) References Cited

U.S. PATENT DOCUMENTS 10,809,637 B1 * 10/2020 Coskun ............... H01L 22/20
2017/0191948 A1   7/2017 Gao et al.
(Continued)

OTHER PUBLICATIONS

International Search Report and Written Opinion for PCT/US2021/061088 dated Mar. 21, 2022.

*Primary Examiner* — Nay A Maung
*Assistant Examiner* — Vaisali Rao Koppolu
(74) *Attorney, Agent, or Firm* — Patterson + Sheridan, LLP

(57) ABSTRACT

Embodiments described herein relate to a system, methods, and non-transitory computer-readable mediums that accurately align subsequent patterned layers in a photoresist utilizing a deep learning model and utilizing device patterns to replace alignment marks in lithography processes. The deep learning model is trained to recognize unique device patterns called alignment patterns in the FOV of the camera. Cameras in the lithography system capture images of the alignment patterns. The deep learning model finds the alignment patterns in the field of view of the cameras. An ideal image generated from a design file is matched with the camera with respect to the center of the field of view of the camera. A shift model and a rotation model are output from the deep learning model to create an alignment model. The alignment model is applied to the currently printing layer.

20 Claims, 13 Drawing Sheets

(51) Int. Cl.
    *G06T 7/00*         (2017.01)
    *G06T 7/33*         (2017.01)
    *G06T 7/73*         (2017.01)
    *G06V 10/75*       (2022.01)
    *G06V 10/764*      (2022.01)

(52) U.S. Cl.
    CPC ............... *G06T 7/337* (2017.01); *G06T 7/73* (2017.01); *G06V 10/7515* (2022.01); *G06V 10/764* (2022.01); *G06T 2207/20081* (2013.01); *G06T 2207/30148* (2013.01); *G06T 2207/30204* (2013.01)

(58) Field of Classification Search
    CPC ........... G06T 7/001; G06T 7/337; G06T 7/73; G06T 2207/20081; G06T 2207/30148; G06T 2207/30204; G06V 10/7515; G06V 10/764; G06V 10/44; G06V 10/774; H04N 7/181; G06N 20/00
    See application file for complete search history.

(56) References Cited

U.S. PATENT DOCUMENTS

| | | | |
|---|---|---|---|
| 2019/0064683 A1* | 2/2019 | Coskun | G03F 7/707 |
| 2019/0086200 A1* | 3/2019 | Amit | G01B 11/272 |
| 2019/0178639 A1 | 6/2019 | Gutman et al. | |
| 2019/0206041 A1 | 7/2019 | Fang et al. | |
| 2019/0303717 A1* | 10/2019 | Bhaskar | G06F 18/214 |
| 2020/0133144 A1* | 4/2020 | Schmitt-Weaver | G03F 9/7088 |
| 2020/0243400 A1 | 7/2020 | Wang et al. | |

\* cited by examiner

DEEP LEARNING BASED ADAPTIVE ALIGNMENT PRECISION METROLOGY FOR DIGITAL OVERLAY

BACKGROUND

Field

Embodiments of the present disclosure generally relate to lithography systems. More particularly, embodiments of the present disclosure relate to a system, and methods using the system to accurately align subsequent patterned layers in a photoresist utilizing a deep learning model and utilizing device patterns to replace alignment marks in lithography processes.

Description of the Related Art

Maskless lithography is used in the manufacturing of semiconductor devices, such as for back-end processing of semiconductor devices, and display devices, such as liquid crystal displays (LCDs). With a conventional lithography environment, to align subsequent layers of a mask pattern into a photoresist disposed over a substrate, alignment marks are required. Furthermore, it is becoming challenging to accurately locate the alignment marks as the marks decrease in size. The use of alignment marks requires a microscope system in the image projection systems of the lithography system that provides large image pixel sizes compared to the small alignment marks, leading to inaccuracy in aligning the subsequent layers when standard image processing algorithms such as cross correlation is applied. Accordingly, what is needed in the art is an improved system, and methods using the system to more accurately align subsequent patterned layers in a photoresist.

SUMMARY

According to another embodiment, a method is provided. The method includes capturing an image in a field of view (FOV) of each camera of a plurality of cameras of a processing unit of a lithography system. The processing unit has a plurality of image projection systems and each image projection system of the plurality of image projection systems includes at least one of each camera of the plurality of cameras. The image includes one or more real objects. The method further includes transferring the image in the FOV to a server in communication with the lithography system. The server includes a deep learning (DL) module and the DL module includes a deep learning (DL) model, a template searcher, and an affine modeler. The method further includes identifying a real class and a real location of the real objects in the FOV. The method further includes locating a template box within the FOV. The template box is located based on object matching with a template. The template includes a plurality of ideal objects. The method further includes fitting a shift model and a rotation model to a location difference between the plurality of ideal objects and the real objects in the FOV.

According to another embodiment, a method is provided. The method includes capturing a sample image in a field of view (FOV) of each camera of a plurality of cameras of a processing unit of a lithography system. The processing unit has a plurality of image projection systems, each image projection system of the plurality of image projection systems including at least one of each camera of the plurality of cameras. The sample image includes one or more sample objects and one or more sample alignment marks. The method further includes transferring the sample image in the FOV to a server in communication with the lithography system. The server includes a deep learning (DL) module and the DL module includes a geometry processing software and a deep learning training engine. The method further includes identifying a positon of the one or more sample alignment marks with the geometry processing software. The method further includes creating a ground truth table with the geometry processing software. The ground truth table includes an ideal class and an ideal location of one or more ideal objects and the ideal location of one or more alignment marks. The method further includes producing an X shift value, a Y shift value, and a rotation value in the deep learning training model. The X shift value, the Y shift value, and the rotation value corresponds to a position difference between the sample alignment marks compared to the ground truth table.

In another embodiment, a non-transitory computer-readable medium is provided. The non-transitory computer-readable medium storing instructions that, when executed by a processor, cause a computer system to perform steps including capturing an image in a field of view (FOV) of each camera of a plurality of cameras of a processing unit of a lithography system. The processing unit has a plurality of image projection systems and each image projection system of the plurality of image projection systems includes at least one of each camera of the plurality of cameras. The image includes one or more real objects. The method further includes transferring the image in the FOV to a server in communication with the lithography system. The server includes a deep learning (DL) module and the DL module includes a deep learning (DL) model, a template searcher, and an affine modeler. The method further includes identifying a real class and a real location of the real objects in the FOV. The method further includes locating a template box within the FOV. The template box is located based on object matching with a template. The template includes a plurality of ideal objects. The method further includes fitting a shift model and a rotation model to a location difference between the plurality of ideal objects and the real objects in the FOV.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to lithography systems. More particularly, embodiments of the present disclosure relate to a system, and methods of using the system to accurately align subsequent patterned layers in a photoresist utilizing a deep learning model and utilizing device patterns to replace alignment marks in lithography processes. The deep learning model is trained, as described herein, to recognize unique device patterns called alignment patterns in the photoresist. Cameras in the lithography system capture images of the alignment patterns. The deep learning model finds the alignment patterns in the field of view of the cameras. An ideal image generated from a design file is matched with the camera image with respect to the center of the field of view of the camera. A shift model and a rotation model are output from the deep learning model. The shift model and the rotation model are used to create an alignment model. The alignment model is applied to the subsequently printed layer.

Figure 1A:
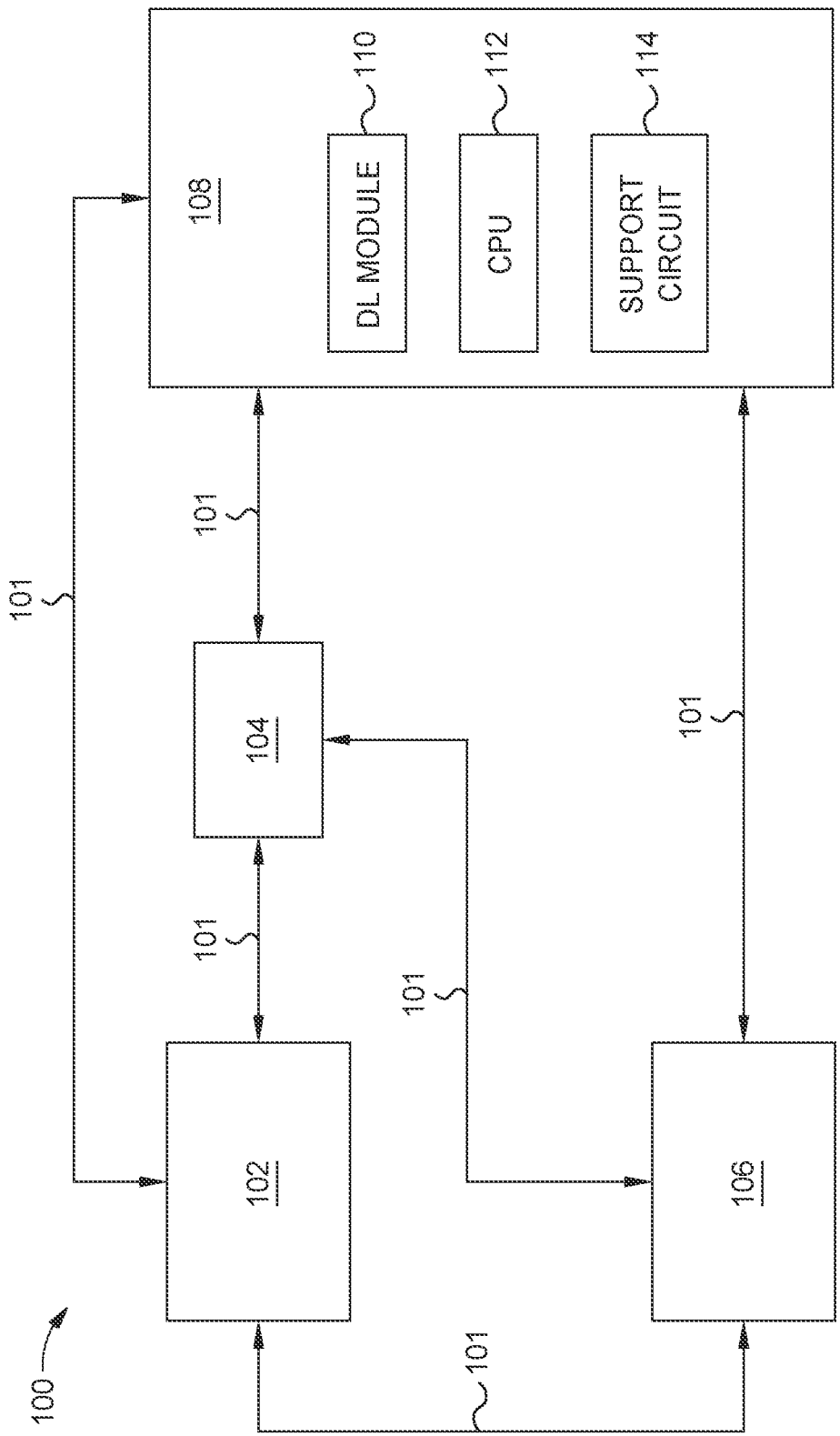
FIG. 1A is a schematic diagram of a lithography environment, according to embodiments described herein.

FIG. 1A is a schematic diagram of a lithography environment 100. As shown, the lithography environment 100 includes, but is not limited to, a virtual mask device 102, a data storage device 104, a maskless lithography device 106, a server 108, and communication links 101. Additional lithography environment devices (i.e., the virtual mask device 102, the data storage device 104, the maskless lithography device 106, and the server 108) may be included in the lithography environment 100. Each of the lithography environment devices is operable to be connected to each other via the communication links 101. Each of the lithography environment devices is operable to be connected to the server 108 by the communication links 101. Alternatively or additionally, each of the lithography environment devices can communicate indirectly by first communicating with the server 108, followed by the server 108 communicating with the lithography environment device in question. The lithography environment 100 can be located in the same area or production facility, or the each of the lithography environment devices can be located in different areas.

Each of the plurality of lithography environment devices are additionally indexed with methods 500, 700, and 900, described herein. Each of the virtual mask device 102, the data storage device 104, the maskless lithography device 106, and the server 108 may include an on-board processor and memory, where the memory is configured to store instructions corresponding to any portion of the methods 500, 700, or 900 described below. The communication links 101 may include at least one of wired connections, wireless connections, satellite connections, and the like. The communications links 101 include sending and receiving a universal metrology file (UMF) or any other file used to store data, according to embodiments further described herein. The communications links 101 can include temporarily or permanently storing files or data in the cloud, before transferring or copying the files or data to the maskless lithography device 106.

The server 108 includes a central processing unit (CPU) 112, support circuits 114 and a deep learning (DL) module 110. The CPU 112 can be one of any form of computer processor that can be used in an industrial setting for controlling the lithography environment devices. The DL module 110 is coupled to the CPU 112. The support circuits 114 are coupled to the CPU 112 for supporting the CPU 112 in a conventional manner. These circuits include cache, power supplies, clock circuits, input/output circuitry, subsystems, and the like. The server 108 can include the CPU 112 that is coupled to input/output (I/O) devices found in the support circuits 114 and the DL module 110.

The CPU 112 can be a hardware unit or combination of hardware units capable of executing software applications and processing data. In some configurations, the CPU 112 includes a central processing unit (CPU), a digital signal processor (DSP), an application-specific integrated circuit (ASIC), a graphic processing unit (GPU) and/or a combination of such units. The CPU 112 is generally configured to execute the one or more software applications and process stored media data, which can be each included within the DL module 110. The server 108 controls the transfer of data and files to and from the various lithography environment devices.

Figure 1B:
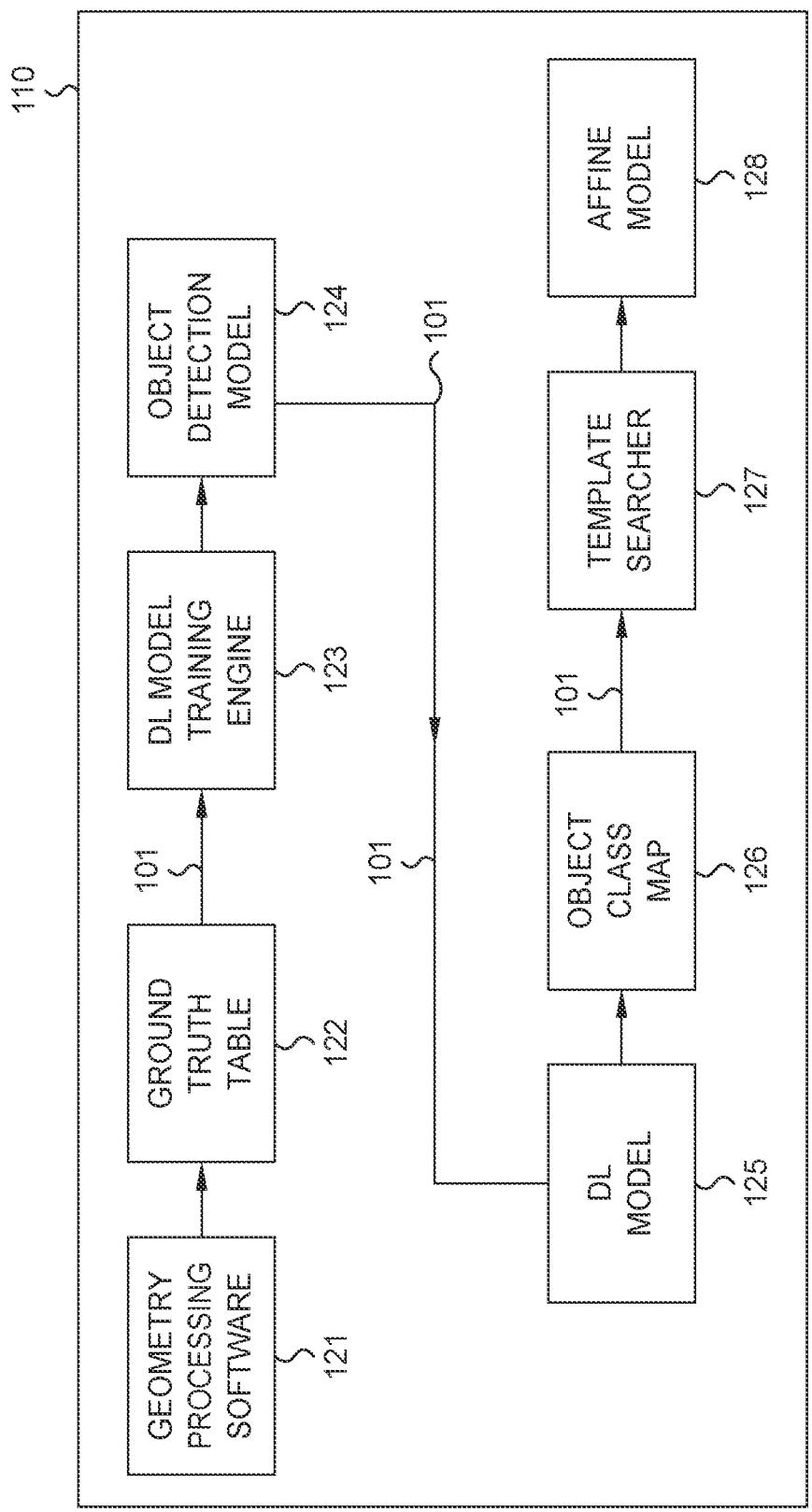
FIG. 1B is a schematic diagram of the deep learning module, according to embodiments described herein.

FIG. 1B is a schematic diagram of the DL module 110. The DL module 110 is included in the server 108. The DL module includes but is not limited to a geometry processing software 121, a ground truth table 122, a DL model training engine 123, an object detection model 124, a DL model 125, an object class map 126, a template searcher 127, and an affine modeler 128.

The geometry processing software 121, the ground truth table 122, the DL model training engine 123, the object detection model 124, the DL model 125, the object class map 126, the template searcher 127, and the affine modeler 128 are configured to communicate with each other via the communication links 101. The geometry processing software 121, the ground truth table 122, the DL model training engine 123, and the object detection model 124 are operable to train the DL model 125, as described in the methods 500 and 700. The geometry processing software 121 is in communication with the data storage device 104 and a lithography server 230 (shown in FIG. 2) of the maskless lithography device 106 via the communication links 101. The DL model training engine 123 and the object detection model 124 are in communication with the data storage device 104 and the lithography server 230 of the maskless lithography device 106 via the communication links 101. The object detection model 124, the DL model 125, the object class map 126, the template searcher 127, and the affine modeler 128 are operable to align patterns of a substrate as described in the method 900. The DL model 125 is in communication with the data storage device 104 and the lithography server 230 of the maskless lithography device 106 via the communication links 101. According to certain embodiments, the DL model 125 may be a supervised or unsupervised machine learning model. The affine modeler 128 is in communication with the data storage device 104 and the lithography server 230 of the maskless lithography device 106 via the communication links 101.

Figure 2:
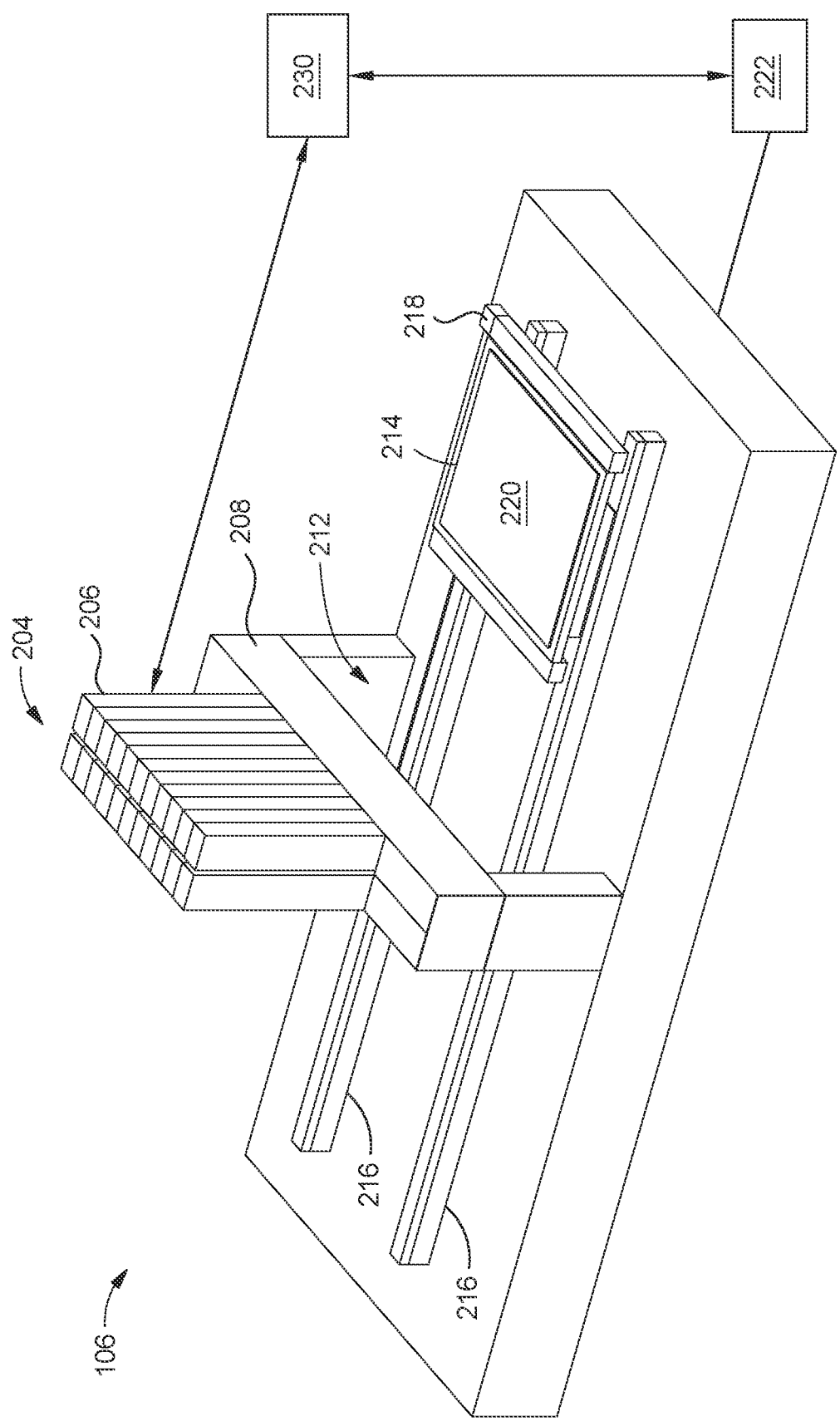
FIG. 2 is a perspective view of an exemplary maskless lithography device, according to embodiments described herein.

FIG. 2 is a perspective view of an exemplary maskless lithography device 106, such as a digital lithography system, that may benefit from embodiments described herein. The maskless lithography device 106 includes a stage 214 and a processing unit 204. The stage 214 is supported by a pair of tracks 216. A substrate 220 is supported by the stage 214. The stage 214 is operable to move along the pair of tracks 216. An encoder 218 is coupled to the stage 214 in order to provide information of the location of the stage 214 to a controller 222.

The controller 222 is generally designed to facilitate the control and automation of the processing techniques described herein. The controller 222 may be coupled to or in communication with the processing unit 204, the stage 214, and the encoder 218. The processing unit 204 and the encoder 218 may provide information to the controller 222 regarding the substrate processing and the substrate aligning. For example, the processing unit 204 may provide information to the controller 222 to alert the controller 222 that substrate processing has been completed. The controller 222 facilitates the control and automation of a maskless lithography process based on a design file provided by a lithography server 230. The design file is created by the virtual mask device 102. The design file (or computer instructions), which may be referred to as an imaging design file or a graphic design system (GDS) file, is readable by the controller 222, determines which tasks are to be performed on a substrate. The design file is provided to the lithography server 230 from the virtual mask device 102 via the communication links 101. The design file includes a mask pattern data. The mask pattern data includes a mask pattern 402 (shown in FIG. 4A) and code to monitor and control the processing time and substrate position. The mask pattern 402 corresponds to a resulting pattern 403 (shown in FIGS. 4B-4D) to be written into the photoresist using the electromagnetic radiation.

The substrate 220 comprises any suitable material, for example, glass, which is used as part of a flat panel display. In other embodiments, which can be combined with other embodiments described herein, the substrate 220 is made of other materials capable of being used as a part of the flat panel display. Additionally, the substrate 220 could be a wafer used in advanced packaging (AP) or similar applications in semiconductor manufacturing. The substrate 220 has a film layer to be patterned formed thereon, such as by pattern etching thereof, and a photoresist formed on the film layer to be patterned, which is sensitive to electromagnetic radiation. For example, ultra-violet (UV) radiation or deep UV "light" can be utilized to pattern the photoresist. A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. After exposure of the photoresist to the electromagnetic radiation, the resist is developed to leave a patterned photoresist on the underlying film layer. Then, using the patterned photoresist, the underlying thin film is pattern etched through the openings in the photoresist to form a portion of the electronic circuitry of the display panel or advanced packaging wafer.

The processing unit 204 is supported by the support 208 such that the processing unit 204 straddles the pair of tracks 216. The support 208 provides an opening 212 for the pair of tracks 216 and the stage 214 to pass under the processing unit 204. The processing unit 204 is a pattern generator configured to receive the mask pattern data from the lithography server 230 and expose the photoresist in the maskless lithography process using one or more image projection systems 206 operable to project write beams of electromagnetic radiation to the substrate 220. The pattern generated by the processing unit 204 is projected by the image projection systems 206 to expose the photoresist of the substrate 220. The photoresist is exposed according to the mask pattern 402. In one embodiment, which can be combined with other embodiments described herein, each image projection system 206 includes a spatial light modulator to modulate the incoming light to create the desired pattern in the photoresist.

Figure 3:
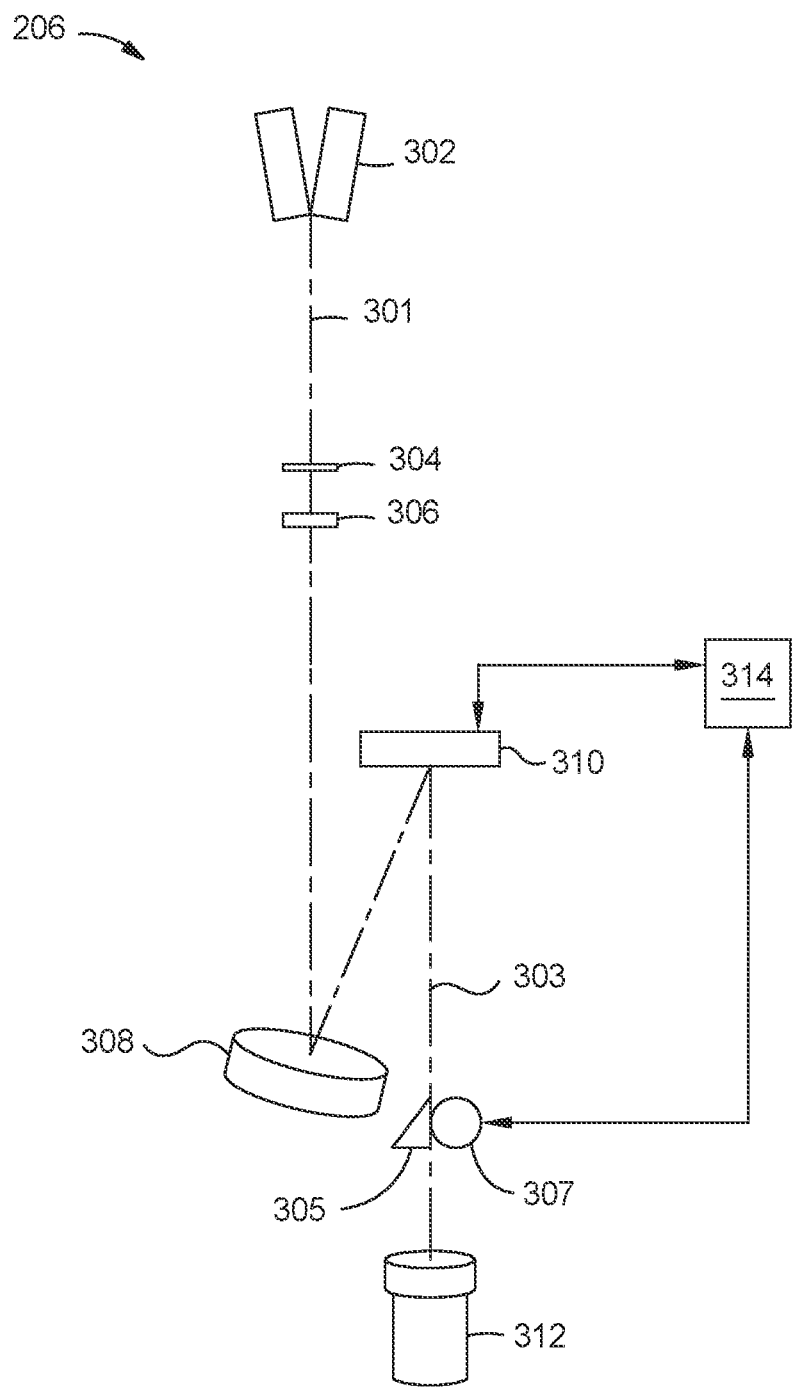
FIG. 3 is a schematic, cross-sectional view of an image projection system, according to embodiments described herein.

FIG. 3 is a schematic, cross-sectional view of an image projection system 206 that may be used in the maskless lithography device 106. The image projection system 206 includes a spatial light modulator 310 and projection optics 312. The components of the image projection system 206 vary depending on the spatial light modulator 310 being used. The spatial light modulator 310 includes, but is not limited to, an array of liquid crystal displays (LCDs), liquid crystal over silicon (LCoS) devices, ferroelectric liquid crystal on silicon (FLCoS) devices, microshutters, microLEDs, VCSELs, liquid crystal displays (LCDs), a digital micromirror device (DMD) or any solid state emitter of electromagnetic radiation. The spatial light modulator 310 includes a plurality of spatial light modulator pixels. Each spatial light modulator pixel of the plurality of spatial light modulator pixels is individually controllable and is configured to project a write beam corresponding to a pixel of a plurality of pixels. The compilation of the plurality of pixels form the resulting pattern 403 (shown in FIG. 4B) of the mask pattern 402. The projection optics 312 includes projection lenses, for example 10×, 6×, 5×, and 2.75× objective lenses, used to project the light onto the substrate 220. In operation, the mask pattern data is provided to an image projection computer 314 by the lithography server 230 and is sent to the spatial light modulator 310. Based on the mask pattern data, each spatial light modular pixel of the plurality of spatial light modulator pixels is at an "on" position or "off" position. Each spatial light modular pixel at an "on" position forms a write beam that the projection optics 312 then projects the write beam to the photoresist layer surface of the substrate 220 to form a pixel of the resulting pattern 403 (shown in FIG. 4B).

Each image projection system 206 includes a focus sensor 307 and a camera 305. The focus sensor 307 and the camera 305 may be configured to monitor various aspects of the imaging quality of the image projection system 206, including, but not limited to, lens focus, alignment, and mirror tilt angle variation. Additionally, the focus sensor 307 may show the image, which is going to be projected onto the substrate 220. In one embodiment, which can be combined with other embodiments described herein, the focus sensor 307 and the camera 305 may be used to capture images on the substrate 220 and make a comparison between those images. In other words, the focus sensor 307 and the camera 305 may be used to perform inspection functions. In another embodiment, which can be combined with other embodiments described herein, the camera 305 captures images of the substrate 220. The camera 305 is configured to continuously capture images in a field of view (FOV) of the camera 305. The images are sent to the image projection computer 314. The image projection computer 314 is configured to do basic image processing and to save the images from the camera 305 and send them to the lithography server 230 (shown in FIG. 2). In one embodiment, which can be combined with other embodiments described herein, each image projection system 206 includes an image projection computer 314. In another embodiment, which can be combined with other embodiments described herein, one image projection computer 314 is in communication with the plurality of image projection systems 206. The lithography server 230 saves the images to the data storage device 104.

In one embodiment, which can be combined with other embodiments described herein, the spatial light modulator 310 is a DMD. The image projection system 206 includes a light source 302, an aperture 304, a lens 306, a frustrated prism assembly 308, the DMD, the camera 305, the focus sensor 307, and the projection optics 312. The DMD includes a plurality of mirrors, i.e, the plurality of spatial light modulator pixels. Each mirror of the plurality of mirrors corresponds to a pixel that may correspond to a pixel of the mask pattern. In some embodiments, the DMD includes more than about 4,000,000 mirrors. The light source 302 is any suitable light source, such as a light emitting diode (LED) or a laser, capable of producing a light having a predetermined wavelength. In one embodiment, the predetermined wavelength is in the blue or near ultraviolet (UV) range, such as less than about 450 nm. The frustrated prism assembly 308 includes a plurality of reflective surfaces. In operation, a light beam 301 is produced by the light source 302. The light beam 301 is reflected to the spatial light modulator 310 by the frustrated prism assembly 308. When the light beam 301 reaches the mirrors of the spatial light modulator 310, each mirror at "on" position reflect the light beam 301, i.e., forms a write beam, also known as a "shot", that the projection optics 312 then projects to shot the photoresist layer surface of the substrate 220. The plurality of write beams 303, also known as a plurality of shots, forms a plurality of pixels of the mask pattern.

Figure 4A:
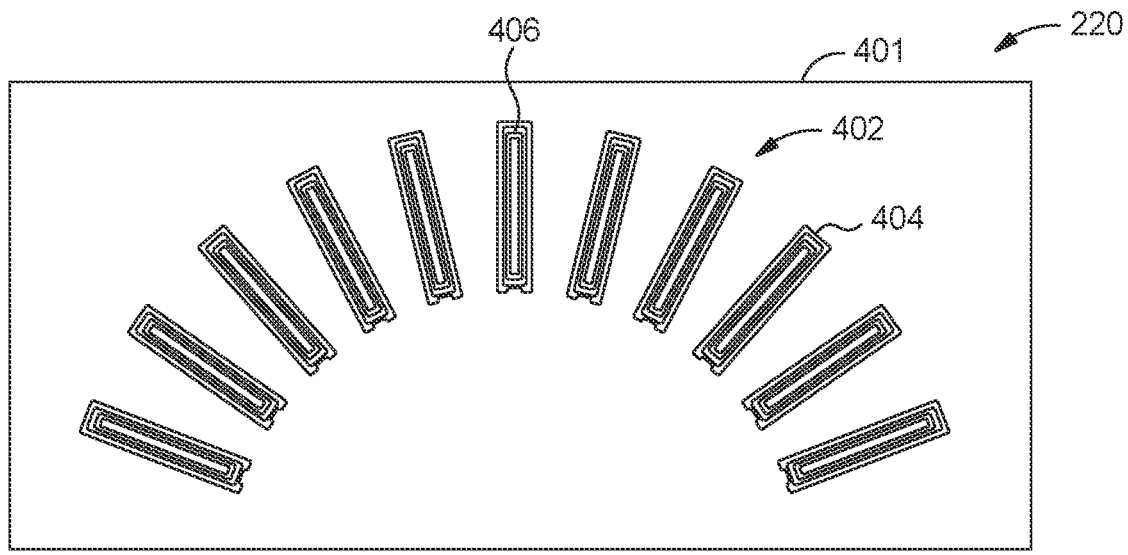
FIGS. 4A and 4B are schematic, plane views of the substrate before a lithography process, according to embodiments described herein.
Figure 4B:
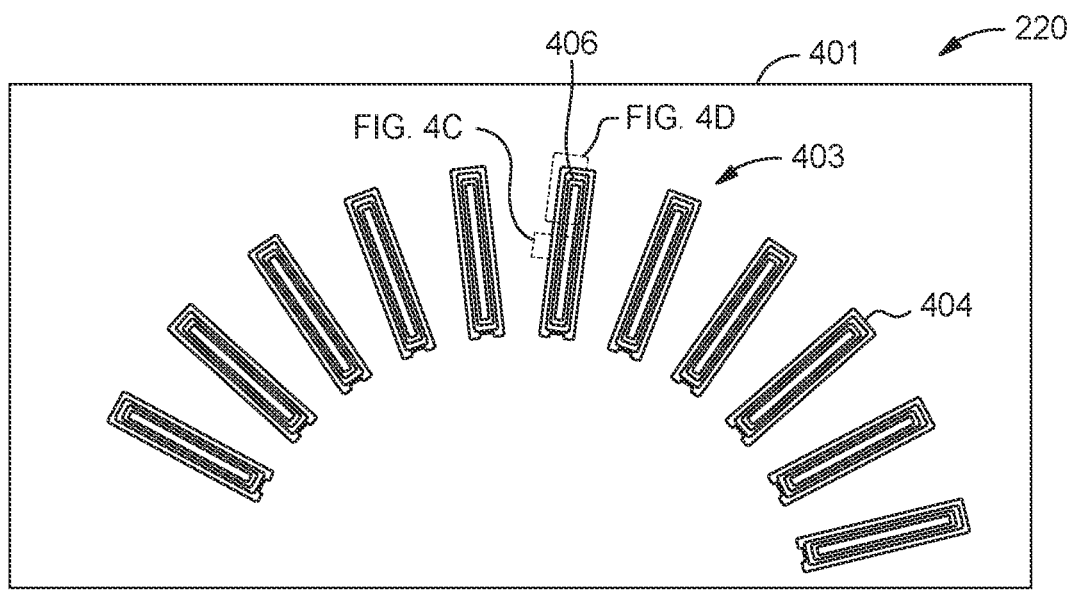

FIGS. 4A and 4B are schematic, plane views of the substrate 220 before a lithography process. A photoresist 401 is disposed over the substrate 220. A design file is sent to the processing unit 204. In one embodiment, which can be combined with other embodiments described herein, the design file is a GDS file. The design file includes mask pattern data including the mask pattern 402 to be patterned.

In one embodiment, which can be combined with other embodiments described herein, the mask pattern data includes the mask pattern 402 and one or more alignment marks 406. The mask pattern 402 is shown in FIG. 4A. The design file is transmitted from the virtual mask device 102 to the processing unit 204 of the maskless lithography device 106 and to the DL module 110. A lithography process is performed to expose the substrate 220 to the mask pattern 402 of the mask pattern data included in the design file to form a resulting pattern 403, as shown in FIG. 4B. Optionally, after the lithography process, the substrate 220 may be further processed, for example by development of the photoresist and/or etching, to form a pattern written into the photoresist 401 on the substrate 220 according to the mask pattern 402. The resulting pattern 403 of the photoresist 401 is exposed according to the mask pattern 402, as shown in FIG. 4B. In one embodiment, which can be combined with other embodiments described herein, the resulting pattern 403 does not substantially match the mask pattern 402. For example, the resulting pattern 403 is shifted in the X direction, the Y direction, and rotated, as shown in FIG. 4B.

The mask pattern 402 includes one or more polygons 404 corresponding to portions of the photoresist 401 to be exposed to electromagnetic radiation projected by the processing unit 204. The resulting pattern 403 includes one or more polygons 404 corresponding to portions of the photoresist 401 exposed to electromagnetic radiation projected by the processing unit 204. It is to be understood that any shaped polygons could be used for the one or more polygons 404, such that exposed portions form one or more different features in the photoresist. The mask pattern 402 and the resulting pattern 403 of the subsequently patterned photoresist 401 according to the mask pattern 402 each have the one or more alignment marks 406. The one or more alignment marks 406 are used to align the mask pattern 402 with the photoresist 401 to be patterned, as described in the method 700. Therefore, a first layer (shown in FIG. 4C) and a second layer (shown in FIG. 4C) are aligned during the patterning process.

Figure 4C:
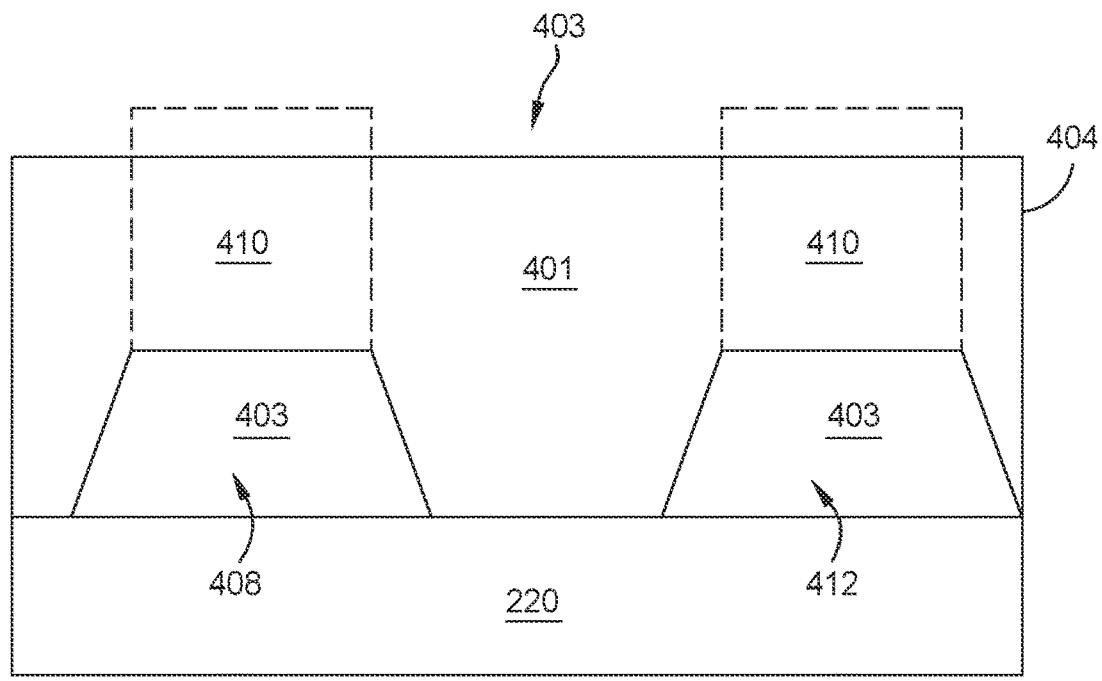
FIG. 4C illustrates a cross-sectional view of one of the one or more polygons of a portion of the substrate, according to embodiments described herein.

FIG. 4C illustrates a cross-sectional view of one of the one or more polygons 404 of a portion of the substrate 220. As shown, the substrate 220 includes the resulting pattern 403 patterned into the photoresist 401. After the resulting pattern 403 is patterned, the method 900 determines a shift model and a rotation model fit according to the location difference of the resulting pattern 403 to the mask pattern 402. A second design file imports the shift model and the rotation model, further described in the method 900, into a second mask pattern data. The second mask pattern data determines where a second pattern 410 is to be patterned in the photoresist 401. The second pattern 410 is to be patterned into the photoresist 401 in direct alignment with the resulting pattern 403. The shift model and the rotation model are factored into the second mask pattern data and therefore the second pattern 410 will align with the resulting pattern 403. The second pattern 410 is a transparent material such that the resulting pattern 403 is visible through the second pattern 410. As shown, the resulting pattern 403 includes a plurality of features 408, 412. Although the plurality of features 408, 412 are illustrated with a particular shape, it is to be understood that any shaped features 408, 412 could be used in the resulting pattern 403. Therefore, the one or more polygons 404 can include any resulting pattern 403 based on the plurality of features 408, 412. Although the plurality of features 408, 412 are illustrated as being the same shape, the plurality of features 408, 412 can be different shapes.

Figure 4D:
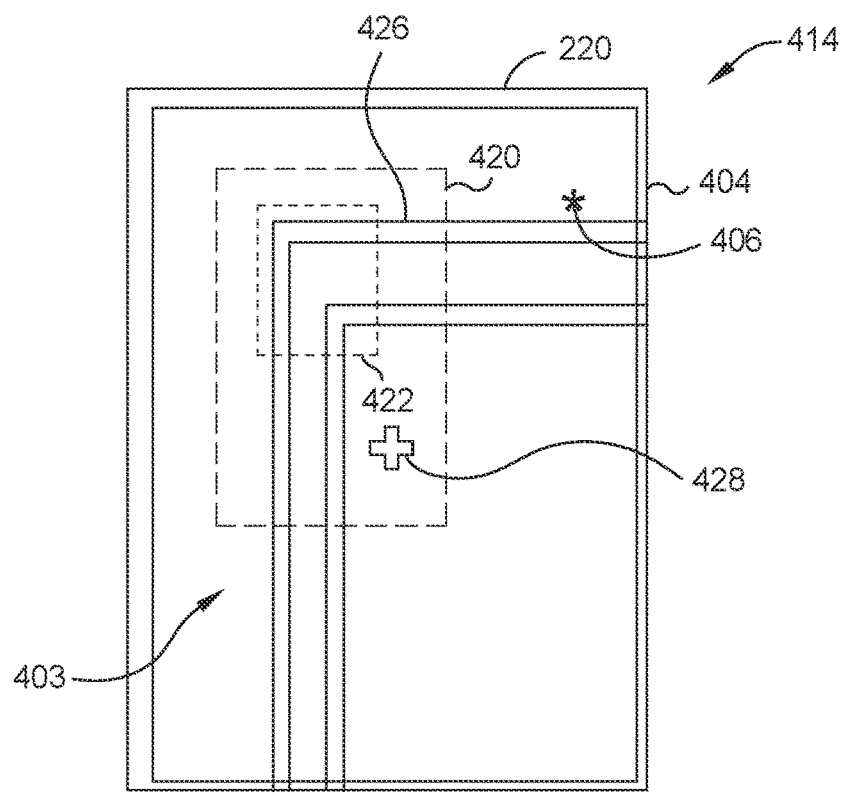
FIG. 4D illustrates a schematic, top view of a portion of the polygon, according to embodiments described herein.

FIG. 4D illustrates a schematic, top view of a portion 414 of the polygon 404. The polygon 404 of the resulting pattern 403 is exposed according to the mask pattern 402, as shown in FIG. 4B. A field of view 420 of the camera 305 is shown overlaid on the portion 414. The field of view 420 of the camera 305 is the region captured in an image of the resulting pattern 403. A stage 214 of the maskless lithography device 106 can move in the X and Y directions to positon the substrate 220 under the camera 305. Therefore, the FOV 420 can be adjusted to capture any area of the polygon 404. In one embodiment, which can be combined with other embodiments described herein, the one or more alignment marks 406 are included on the polygon 404. In another embodiment, which can be combined with other embodiments described herein, the alignment mark 406 is positioned outside of the polygon 404. Variations of the resulting pattern 403 may be added around the one or more alignment marks 406.

A template box 422 is shown on the polygon 404. The template box 422 is within the FOV 420. In one embodiment, which can be combined with other embodiments described herein, the template box 422 and the FOV 420 can include the one or more alignment marks 406, as described in the method 700. The resulting pattern 403 can further include alignment patterns 426. The alignment patterns 426 are patterns designed in the resulting pattern 403 and the mask pattern 402 that are dissimilar from other surrounding patterns in the mask pattern 402. The alignment patterns 426 are irregularities in the mask pattern 402. In one embodiment, which can be combined with other embodiments described herein, an alignment pattern 426 can be a unique pattern in the photoresist.

In another embodiment, which can include other embodiments described herein, the resulting pattern 403 can include target features 428. The target features 428 can correspond to one or more locations on the polygon 404 where the resulting pattern 403 is modified to create a unique pattern i.e., the target feature 428, in the photoresist. In embodiments where the target features 428 are utilized, the template box 422 can be moved such that the target features 428 are within the template box 422. The target features 428 include, but are not limited to, cross (shown in FIG. 4D), rectangular, square, circular, semicircular, triangular, and/or other patterns readable by the maskless lithography device 106.

Figure 5:
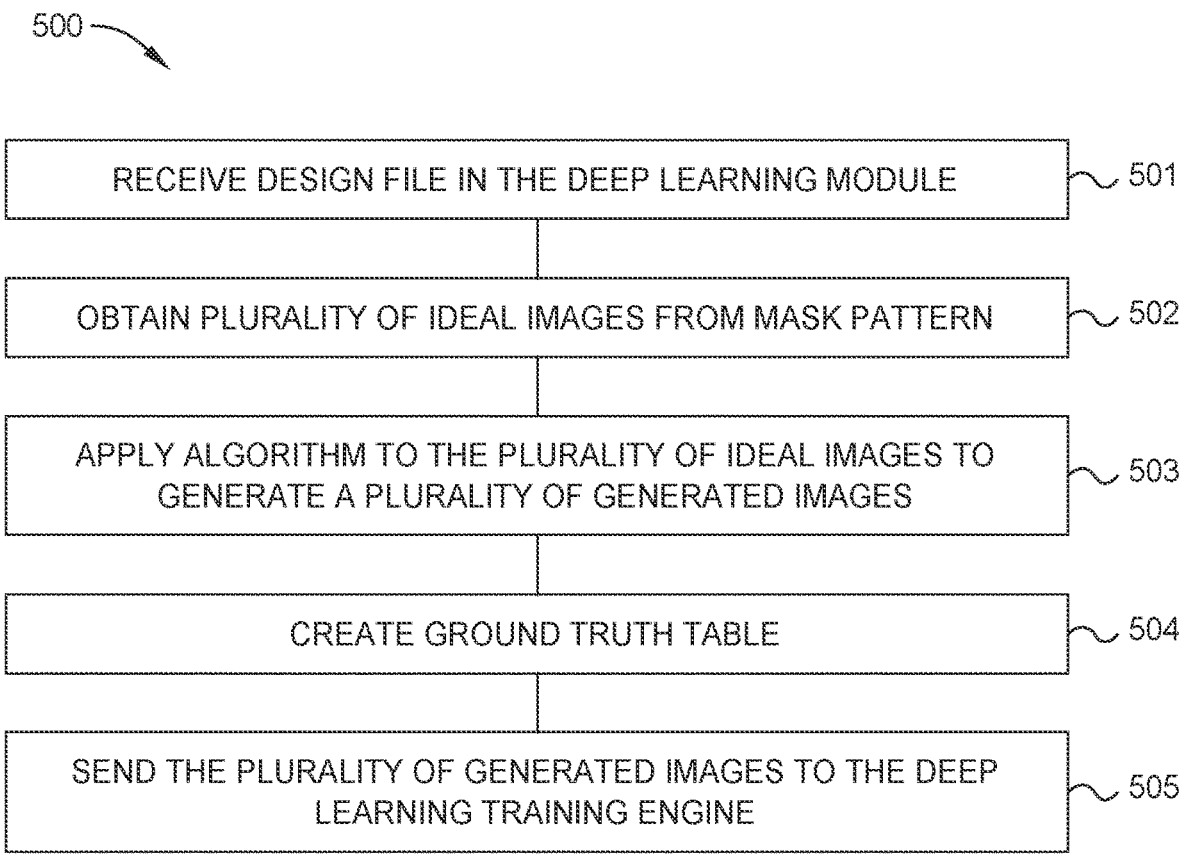
FIG. 5 is a flow diagram of a method for training a DL model, according to embodiments described herein.
Figure 6:
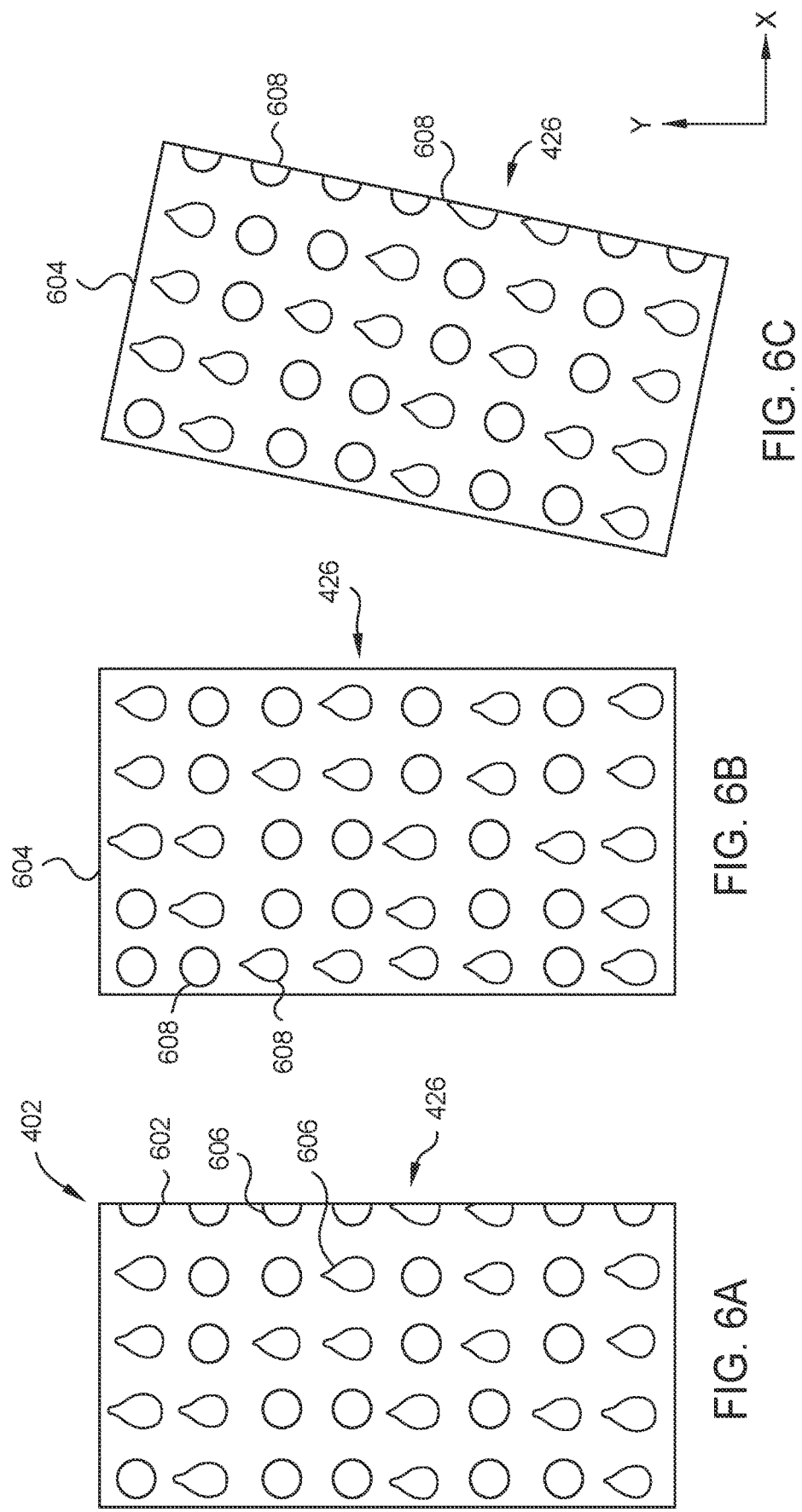
FIG. 6A is a schematic view of an ideal image of the mask pattern, according to embodiments described herein.
FIGS. 6B and 6C are schematic views of a plurality of generated images of the mask pattern, according to embodiments described herein.

FIG. 5 is a flow diagram of a method 500 for training a DL model 125. FIG. 6A is a schematic view of an ideal image 602 of the mask pattern 402. FIGS. 6B and 6C are schematic views of a plurality of generated images 604 of the mask pattern 402. The method 500 is performed first to train the DL model 125. According to certain embodiments, the DL model 125 is trained offline, or at a time before method 900 is undertaken, while in other embodiments, training may occur concurrently with the method 900.

At operation 501, a design file such as a GDS file is received in the DL module 110. The design file was originally stored in the data storage device 104 and is sent to the DL module 110 via a communication link 101. The design file includes a mask pattern 402. The mask pattern 402 is analyzed to determine the location of the alignment patterns 426 in the mask pattern 402.

At operation 502, at least one ideal image 602 is obtained of the mask pattern 402. Each ideal image 602 of the plurality of ideal images 602 includes ideal objects 606. The ideal objects 606 can have different shapes, as shown in FIG. 6A. The shapes of the ideal objects 606 correspond to classes of the ideal objects 606. The plurality of ideal images 602 correspond to portions of the mask pattern 402 with the alignment patterns 426. For example, the ideal image 602 in FIG. 6A corresponds to the field of view 420 shown in FIG. 4D. The alignment patterns 426 are locations in the mask pattern 402 that have irregularities in the mask pattern 402. Therefore, the alignment patterns 426 are identifiable locations on the mask pattern 402 compared to other locations of the mask pattern 402. In one embodiment, which can be combined with other embodiments described herein, target features 428 (shown in FIG. 4D) can be utilized in place of the alignment patterns 426.

At operation 503, an algorithm is applied to the ideal images 602. The algorithm is operable to generate at least one generated image 604 (shown in FIG. 6B) from the ideal images 602. The algorithm is run in the geometry processing software 121 of the DL module 110 in the server 108 (shown in FIGS. 1A and 1B). In one embodiment, which can be combined with other embodiments described herein, the algorithm is generated based on empirical camera models. In another embodiment, which can be combined with other embodiments described herein, the algorithm is generated with a deep learning model, as described herein.

The generated images 604 are images of the ideal images 602 including, but not limited to, shifts, rotations, noise, and blurring due to imaging defocus or resolution limits of the image projection system 206. Further, the he generated images 604 are images of the ideal images 602 including, but not limited to, illumination, texture or contrast changes due to variations of the materials under the photoresist 401, and other effects that would occur during a lithography process such as substrate shift and substrate rotation. The plurality of generated images 604 include generated objects 608. FIG. 6B is a generated image 604 corresponding to a shift in the −X direction of the ideal image 602. FIG. 6C is a generated image 604 corresponding to a rotation of the ideal image 602.

At operation 504, a ground truth table 122 is created. The ground truth table 122 is created from the mask pattern 402 by sending the design file through the geometry processing software 121. The geometry processing software 121 analyzes the plurality of ideal images 602 with pattern recognition software. The geometry processing software 121 identifies the ideal objects 606 in the ideal images 602. Each ideal object 606 is assigned identifiers such as the ideal class and the ideal location of the ideal objects 606. Although only two classes are shown herein, any number of classes can be identified by the geometry processing software 121. The ideal class and the ideal location of each ideal object 606 are compiled to generate the ground truth table 122. The ground truth table is then input into the DL model training engine 123 of the DL module 110.

At operation 505, the plurality of generated images 604 are sent to the DL model training engine 123. The DL model training engine 123 is a software that when executed is operable to compare the plurality of generated images 604 to the ground truth table 122. The DL model training engine 123 is further operable to produce an X shift value, a Y shift value, and a rotation value corresponding to the position difference between the generated objects 608 compared to the ground truth table 122. Performing the method 500 trains the object detection model 124 to recognize the generated objects 608 despite the effects applied by the geometry processing software 121 during the operation 503.

Figure 7:
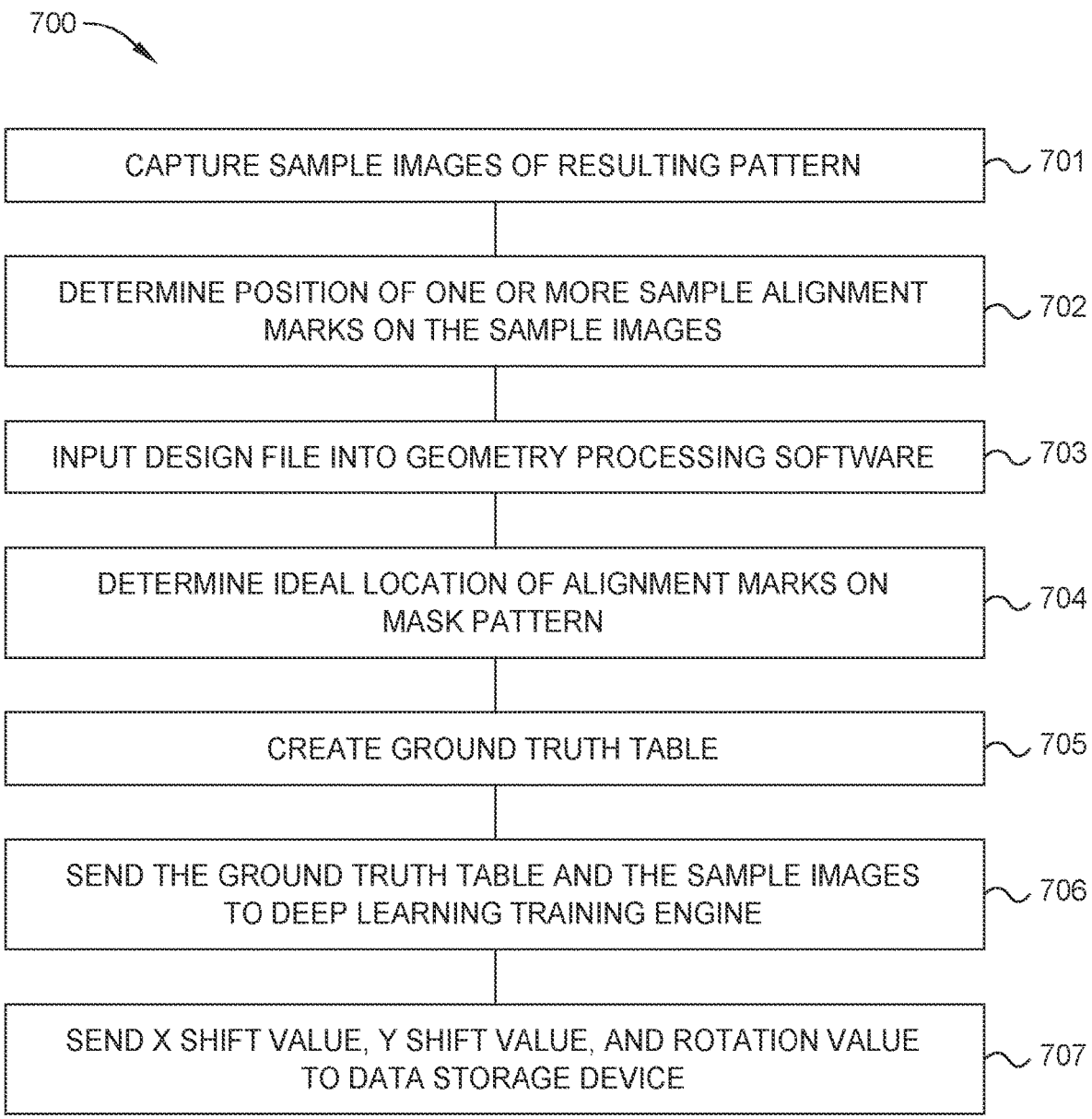
FIG. 7 is a flow diagram of a method for training a DL model, according to embodiments described herein.
Figure 8B:
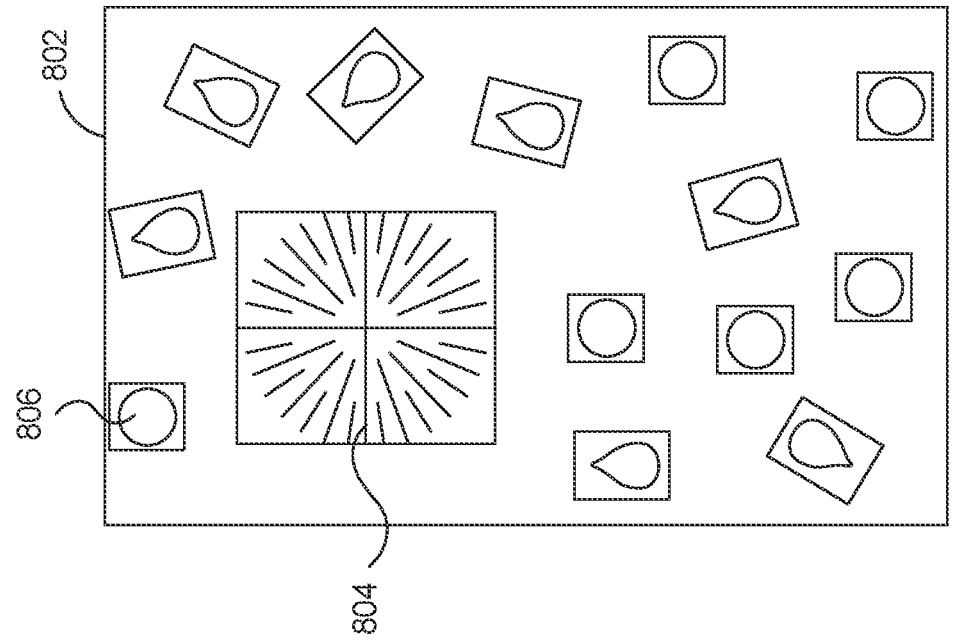
FIG. 8B is a schematic view of a sample image, according to embodiments described herein.
Figure 8A:
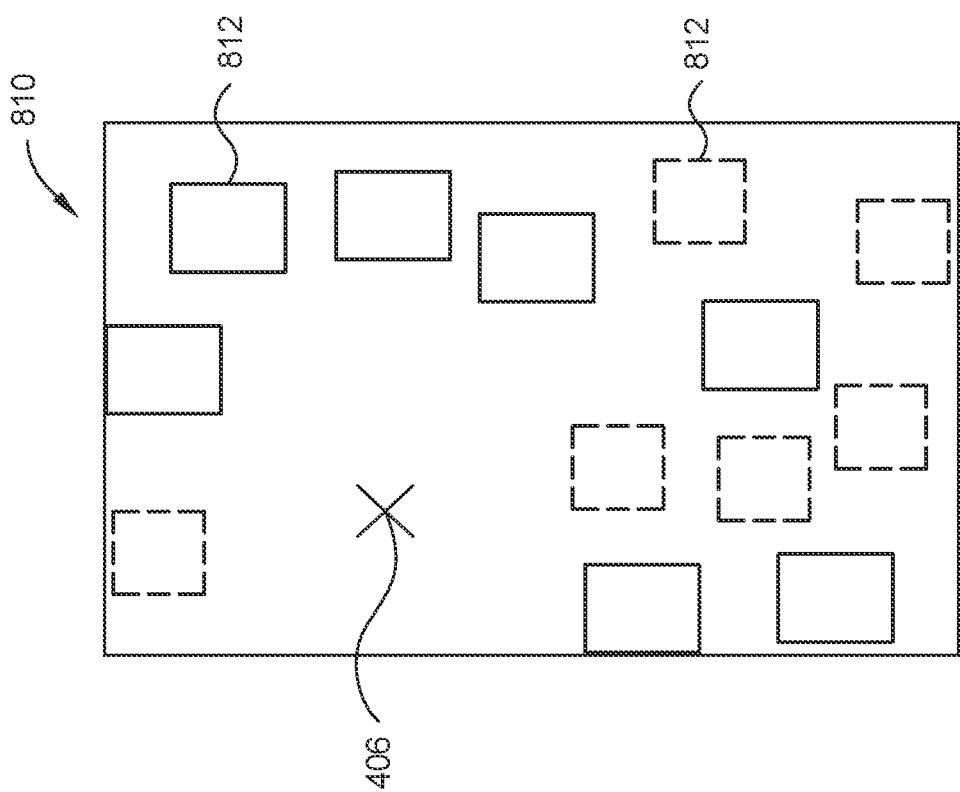
FIG. 8A is a schematic view of the template of a mask pattern, according to embodiments described herein.

FIG. 7 is a flow diagram of a method 700 for training a DL model 125. FIG. 8A is a schematic view of a template pattern 810. FIG. 8B is a schematic view of a sample image 802. In one embodiment, which can be combined with other embodiments described herein, the method 700 is performed after the method 500. Prior to operation 701, the resulting pattern 403 is patterned into the substrate 220 in a maskless lithography device 106, such as a digital lithography system. The maskless lithography device 106 patterns the substrate 220 using one or more image projection systems 206 of a processing unit 204. According to certain embodiments, the DL model 125 is trained offline, or at a time before method 900 is undertaken, while in other embodiments, training may occur concurrently with the method 900.

At operation 701, at least one sample image 802 of the resulting pattern 403 of the mask pattern 402 is captured. Each camera 305 in the one or more image projection systems 206 captures the sample images 802 and sends them to the lithography server 230. The sample images 802 are then stored in the data storage device 104. The sample images 802 include one or more sample alignment marks 804 and one or more sample objects 806. The sample objects 806 correspond to the resulting pattern 403 and therefore are variations of the mask pattern 402 that are to be input into the DL model 125.

At operation 702, the position of the one or more sample alignment marks 804 on the sample images 802 are determined. The position of the one or more sample alignment marks 804 are determined by the geometry processing software 121 of the DL module 110. The one or more sample objects 806 are each assigned sample locations and sample classes in relation to the sample alignment marks 804. The sample classes correspond to the shapes of the sample objects 806.

At operation 703, a design file, such as a GDS file, is input into the geometry processing software 121. The design file includes the mask pattern 402 (see FIG. 6A). The mask pattern 402 includes the one or more alignment marks 406 and the ideal objects 606 (see FIG. 6A).

At operation 704, the ideal location of the alignment marks 406 are determined. The ideal location of the alignment marks 406 of the mask pattern 402 are determined by the geometry processing software 121. The ideal objects 606 are each assigned object locations and object classes in relation to the alignment marks 406 from the design file.

At operation 705, a ground truth table 122 is created. The object locations and the object classes of the ideal objects 606 in relation to the alignment marks 406 are identified. The sample locations and sample classes in relation to the sample alignment marks 804 are also identified. The object locations and the object classes are determined by using the sample locations and the sample objects to locate and tag the template objects 812 to create the template pattern 810 (shown in FIG. 8A). The template pattern 810 depicts template objects 812. The template pattern 810 is used to create the ground truth table 122.

At operation 706, the ground truth table 122 and the sample images 802 are sent to the DL model training engine 123. The DL model training engine 123 compares the sample images 802 to the ground truth table 122. The DL model training engine 123 produces an X shift value, a Y shift value, and a rotation value corresponding to the position difference between the sample alignment marks 804 compared to the ground truth table 122.

At operation 707, the DL model training engine 123 sends the X shift value, the Y shift value, and the rotation value obtained in operation 706 to the data storage device 104. Each time the method 700 is performed, the X shift value, the Y shift value, and the rotation value obtained in operation 706 is stored in the data storage device to improve the object detection model 124. The object detection model 124 is stored in the data storage device 104.

Figure 9:
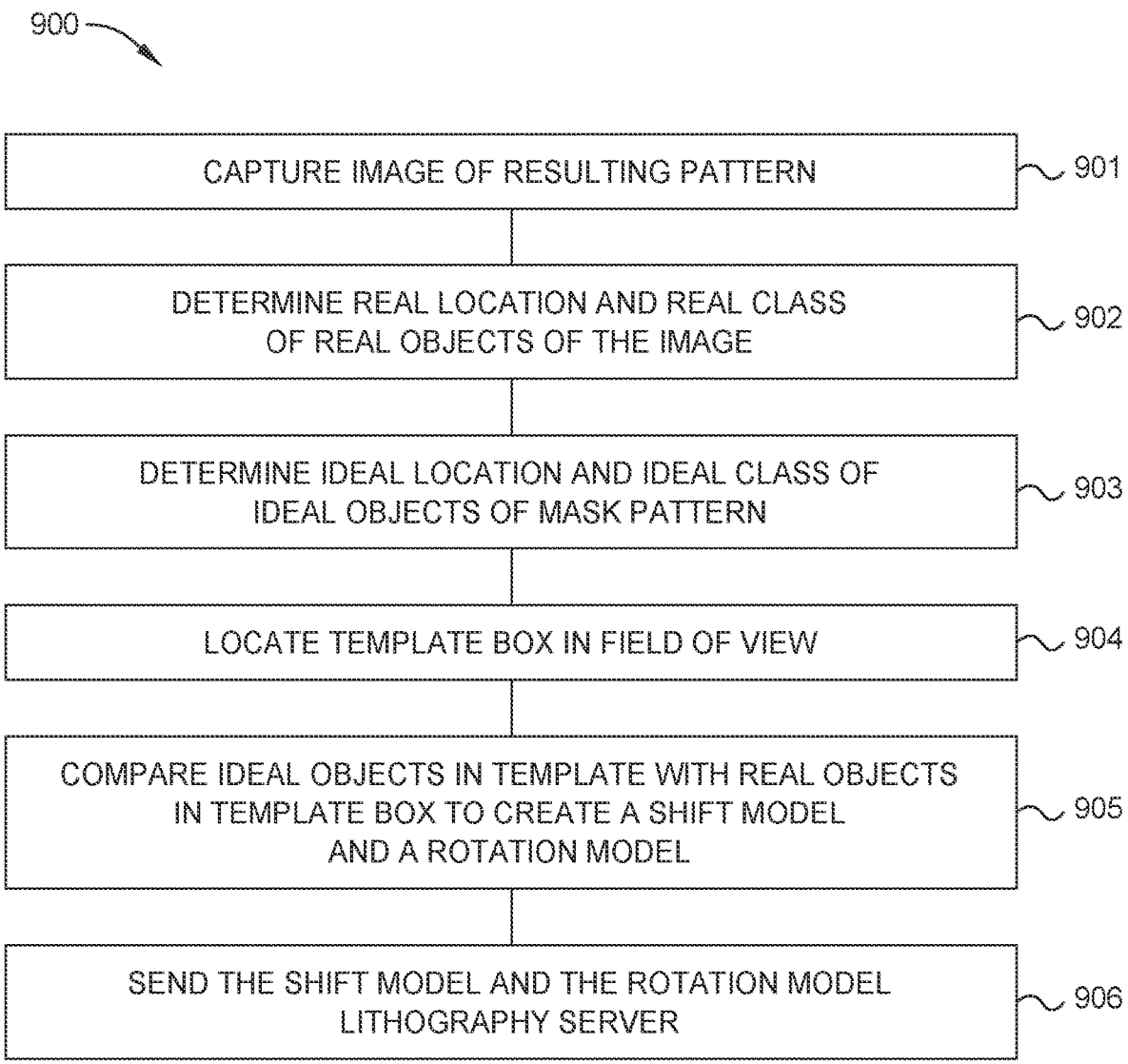
FIG. 9 is a flow diagram of a method for aligning a first pattern and a second pattern utilizing the deep learning model, according to embodiments described herein.
Figure 10B:
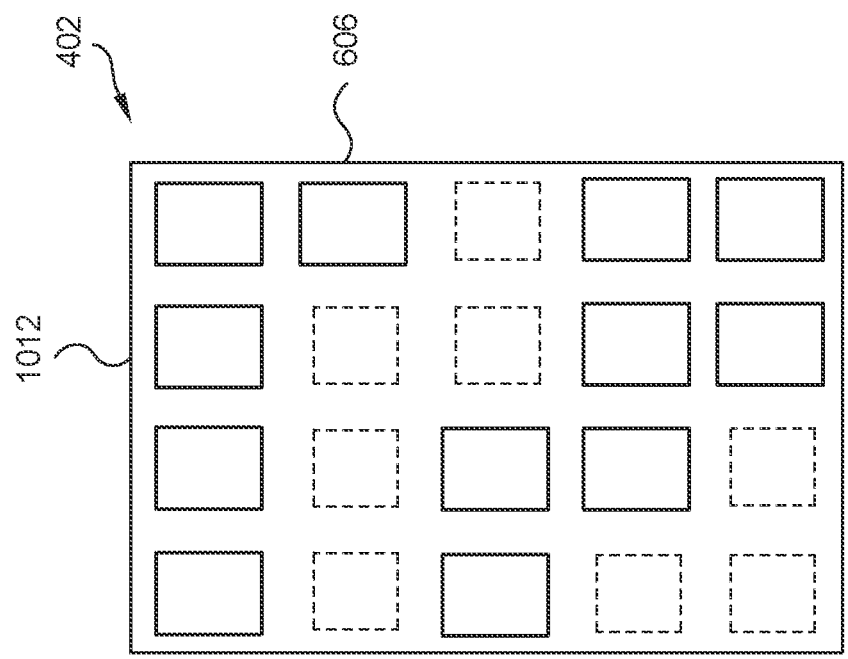
FIG. 10B is a schematic view of a template of the mask pattern, according to embodiments described herein.
Figure 10A:
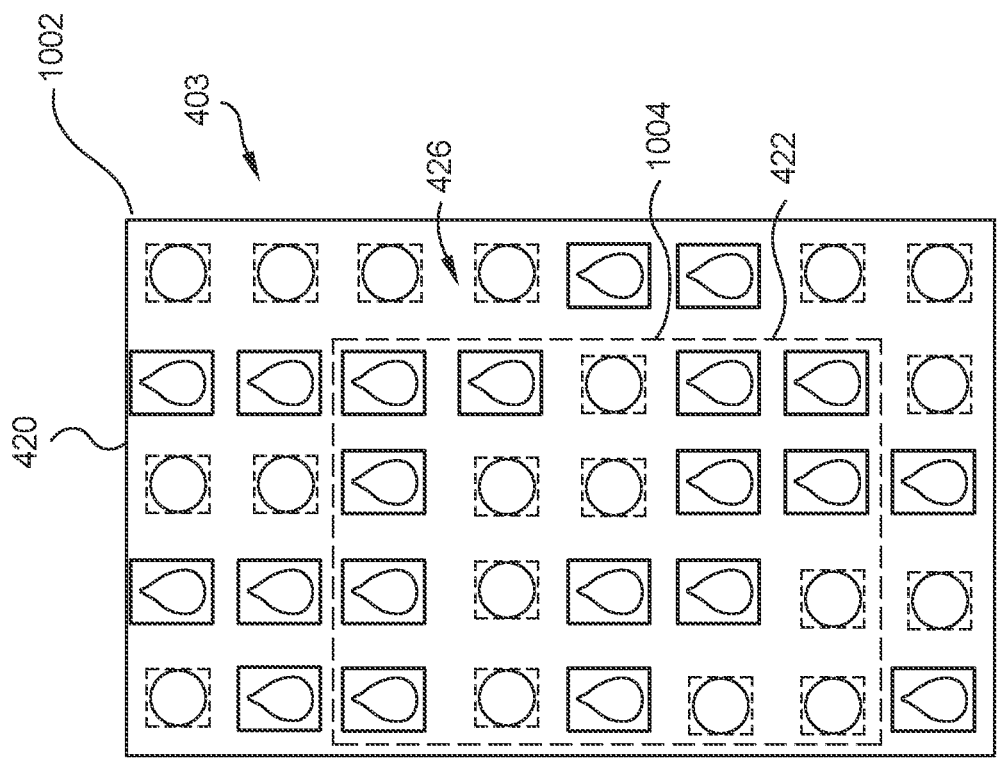
FIG. 10A is a schematic view of an image corresponding to a field of view of a camera, according to embodiments described herein.

FIG. 9 is a flow diagram of a method 900 for aligning the resulting pattern 403 and the second pattern 410 utilizing the DL module 110. FIG. 10A is a schematic view of an image 1002. The image 1002 is an image corresponding to the FOV 420 of the camera 305 of FIG. 4D. FIG. 10B is a schematic view of a template 1012 of the mask pattern 402. Prior to operation 901, the resulting pattern 403 is patterned into the substrate 220 in a maskless lithography device 106, such as a digital lithography system. The maskless lithography device 106 patterns the substrate 220 using one or more image projection systems 206 of a processing unit 204.

At operation 901, the camera 305 of one or more image projection systems 206 captures the image 1002 of the resulting pattern 403. The image 1002 corresponds to portions of the resulting pattern 403 in the FOV 420 of the camera 305 of one or more image projection systems 206. The FOV 420 is positioned to capture an alignment pattern 426 in the image 1002. The alignment patterns 426 are identified prior to the method 900 based on the design file. The deep learning (DL) model 125 described herein will determine the location of the alignment patterns 426 within the FOV 420. In one embodiment, which can be combined with other embodiments described herein, target features 428 can be placed in the FOV 420 in place of the alignment patterns 426. The image 1002 is uploaded to each image projection computer 314 of each image projection system 206. The image 1002 is then uploaded to the lithography server 230. The image 1002 includes one or more real objects 1004. The one or more real objects 1004 can have different shapes, as shown in FIG. 10A. The shapes of the one or more real objects 1004 correspond to classes of the real objects 1004.

At operation 902, a real location and a real class of each of the real objects 1004 in the image 1002 are determined. The object detection model 124 and the image 1002 in the lithography server 230 are transferred to the server 108. The server 108 includes the DL model 125. The DL model 125 is a software that, when executed, analyzes the image 1002 to determine the real location and the real class of each of the real objects 1004. The real location and real class of the real objects 1004 are used to create an object class map 126.

A design file, such as a GDS file, includes the mask pattern 402 having ideal objects 606. At operation 903, the ideal location and the ideal class of the ideal objects 606 of a portion of the mask pattern 402 are determined. The ideal locations and ideal classes of each ideal object 606 in this portion are used to create a template 1012, as shown in FIG. 10B. At operation 904, the template box 422 is located in the FOV 420. The template 1012 and the image 1002 are both sent to the template searcher 127. The template searcher 127 is a software program that, when executed, is operable to locate the template box 422 in the image 1002 based on pattern matching with the template 1012.

At operation 905, the ideal objects 606 in the template 1012 are compared with the real objects 1004 in the template box 422. The ideal locations of the ideal objects 606 and the real locations of the real objects 1004 are fit to a shift model and a rotation model with the affine modeler 128. The shift model is a software program that, when executed, is operable to provide each real object 1004 with an X shift location and a Y shift location. The rotation model is a software program that, when executed, is operable to provide each real object 1004 with a rotation. The shift model and the rotation model are fit to the distance each real object 1004 is displaced compared to the corresponding ideal object 606 from the template 1012. Operations 901-904 can be repeated with different alignment patterns 426 on the substrate 220.

At operation 906, the shift model and rotation model are sent to the lithography server 230 of the maskless lithography device 106. In one embodiment, which can be combined with other embodiments described herein, the method 900 can be repeated for different locations on the substrate 220. The shift models and the rotation models from each location are combined to create an alignment model. The alignment model is a collection of the shift models and the rotation models from each location on the substrate 220. The alignment model is applied to the second pattern 410. In one embodiment, which can be combined with other embodiments described herein, the lithography server 230 provides information to the controller 222 based on the alignment model. The controller 222 will provide instructions to adjust the processing unit 204 or the stage 214 according to the alignment model. In another embodiment, which can be combined with other embodiments described herein, a second mask pattern data corresponding to the second pattern 410 is altered to account for the alignment model. After operation 906, the second pattern 410 (shown in FIG. 4C) is patterned on the substrate 220. The second pattern 410 is directly aligned with the resulting pattern 403.

Figure 11:
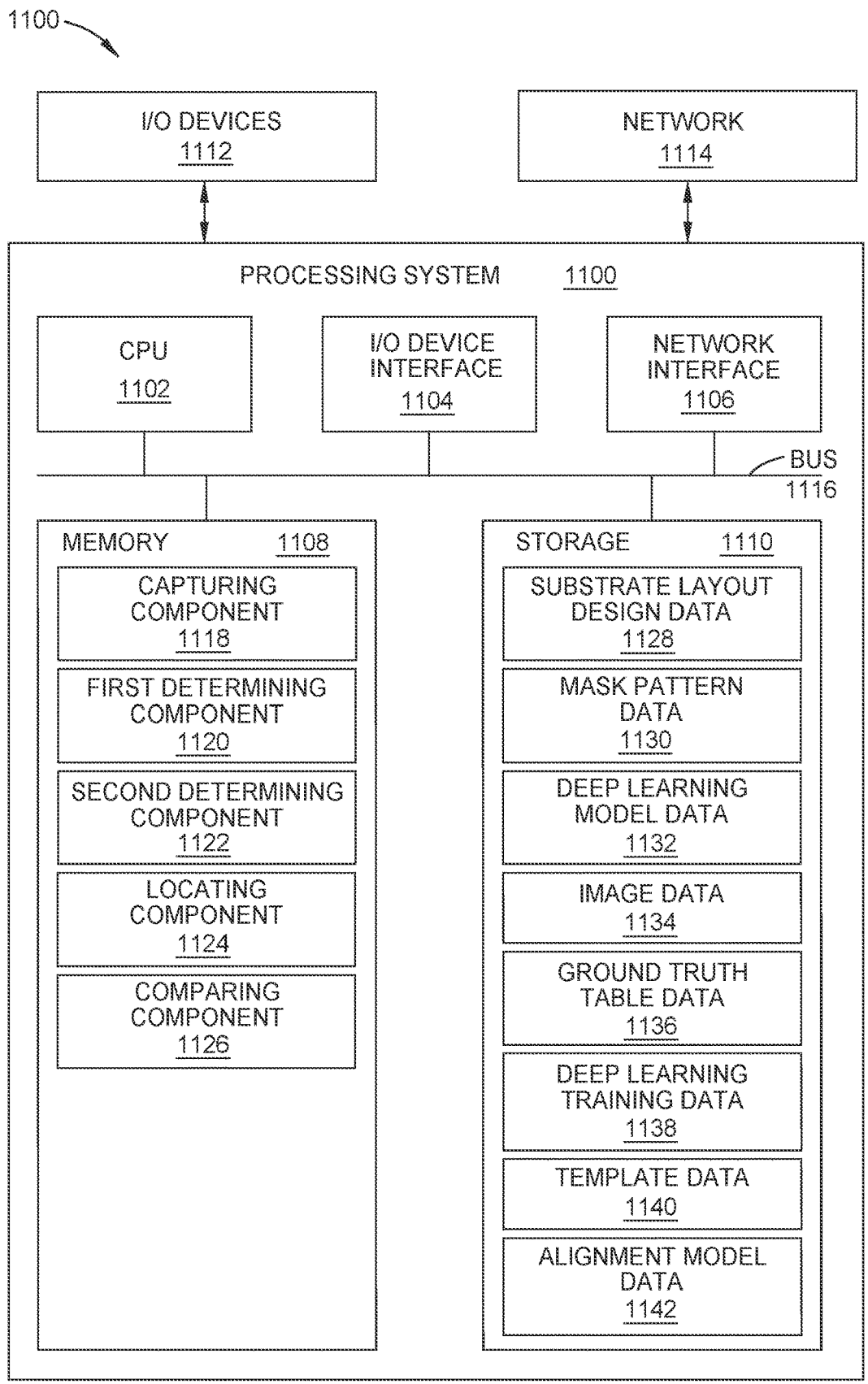
FIG. 11 depicts a processing system, according to embodiments described herein.

FIG. 11 depicts a processing system 1100, according to embodiments described herein. Processing system 1100 is an example of server 108, according to certain embodiments, and may be used in place of the server 108 described above. FIG. 11 depicts an example processing system 1100 that may operate embodiments of systems described herein to perform flow diagrams and methods described herein, such as the methods 500, 700, and 900 described herein.

Processing system 1100 includes a central processing unit (CPU) 1102 connected to a data bus 1116. The CPU 1102 is configured to process computer-executable instructions, e.g., stored in memory 1108 or storage 1110, and to cause the processing system 1100 to perform embodiments of methods described herein on embodiments of systems described herein. The CPU 1102 is included to be representative of a single CPU, multiple CPUs, a single CPU having multiple processing cores, and other forms of processing architecture capable of executing computer-executable instructions. The processing system 1100 further includes input/output (I/O) device(s) 1112 and interfaces 1104, which allows processing system 1100 to interface with input/output devices 1112, such as, for example, keyboards, displays, mouse devices, pen input, and other devices that allow for interaction with processing system 1100. Note that processing system 1100 may connect with external I/O devices through physical and wireless connections (e.g., an external display device).

The processing system 1100 further includes a network 1114 interface, which provides the processing system 1100 with access to external network 1114 and thereby external computing devices. The processing system 1100 further includes memory 1108, which in this example includes a capturing component 1118, first determining component 1120, second determining component 1122, locating component 1124, and comparing component 1126 for performing operations described herein, for example as described in connection with FIG. 9. Note that while shown as a single memory 1108 in FIG. 11 for simplicity, the various aspects stored in memory 1108 may be stored in different physical memories, including memories remote from processing system 1100, but all accessible by the CPU 1102 via internal data connections such as bus 1116.

The storage 1110 further includes substrate layout design data 1128, mask pattern data 1130, deep learning model data 1132, image data 1134 (corresponding to ideal images 602, generated images 604, sample images 802, and the image 1002), ground truth table data 1136 (corresponding to the ground truth table 122), deep learning training data 1138 (corresponding to the DL model training engine 123), and template data 1140 (corresponding to the template 1012), and alignment model data 1142 (corresponding to the alignment model) for performing operations described herein. As would be appreciated by one of ordinary skill, other data and aspects may be included in storage 1110.

As with memory 1108, a single storage 1110 is depicted in FIG. 11 for simplicity, but various aspects stored in storage 1110 may be stored in different physical storages, but all accessible to CPU 1102 via internal data connections, such as bus 1116, or external connection, such as network interfaces 1106. One of skill in the art will appreciate that one or more elements of processing system 1100 may be located remotely and accessed via a network 1114.

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a c c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more operations or actions for achieving the methods. The method operations and/or actions may be interchanged with one another without departing from the scope of the claims. In other words, unless a specific order of operations or actions is specified, the order and/or use of specific operations and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

In summation, embodiments of the present disclosure generally relate to lithography systems. More particularly, embodiments of the present disclosure relate to a system, and methods using the system to accurately align subsequent patterned layers in a photoresist utilizing a deep learning model and utilizing device patterns to replace alignment marks in lithography processes. The deep learning model is trained to recognize unique device patterns called alignment patterns in the FOV of the camera. Cameras in the lithography system capture images of the alignment patterns. The deep learning model finds the alignment patterns in the field of view of the cameras. An ideal image generated from a design file is matched with the camera with respect to the center of the field of view of the camera. A shift model and a rotation model are output from the deep learning model. The shift model and the rotation model are used to create an alignment model. The alignment model is applied to the currently printing layer. The deep learning model is trained according to methods described herein. The methods include inputting a ground truth table and generated images into a deep learning model training engine. The deep learning model training engine trains an object detection model. Additionally, the methods include inputting a ground truth table and sample images from substrates into the deep learning model training engine. The deep learning model utilizes the trained object detection model.

Embodiments of the present disclosure further relate to any one or more of the following examples 1-26:

1. A server, comprising: a deep learning (DL) module, the DL module operable to: identify a real class and a real location of a plurality of real objects within an image of a FOV of a camera of a lithography system, the server operable to be in communication with the lithography server and the lithography server operable to be in communication with the camera; locate a template box within the FOV, the template box located based on object matching with a template, the template including a plurality of ideal objects; and fit a shift model and a rotation model to a location difference between the plurality of ideal objects and the plurality of real objects within the FOV.
2. The server according to example 1, wherein the DL module includes a deep learning (DL) model, a template searcher, and an affine modeler.
3. The server according to example 2, wherein the DL model is operable to identify the real class and the real location of the plurality of real objects within the FOV.
4. The server according to example 2, wherein the template searcher is operable to locate the template box within the FOV.
5. The server according to example 2, wherein the affine modeler is operable to fit the shift model and the rotation model to the location difference between the plurality of ideal objects and the plurality of real objects within the FOV.
6. The server according to example 1, wherein the server is operable to be in communication with the lithography server and a lithography system or a virtual mask device through communication links and the lithography server is operable to be in communication with the camera, the shift model and the rotation model transferable to the lithography system or the virtual mask device.
7. The server according to example 6, wherein the server is operable to be in communication with a data storage device, the data storage device operable to be in communication with the lithography system, the virtual mask device, and the server through the communication links.
8. The server according to example 7, wherein the virtual mask device is operable to create a mask pattern data.
9. A method, comprising: capturing an image in a field of view (FOV) of each camera of a plurality of cameras of a processing unit of a lithography system, the processing unit having a plurality of image projection systems, each image projection system of the plurality of image projection systems including at least one of each camera of the plurality of cameras, the image including one or more real objects; transferring the image in the FOV to a server in communication with the lithography system, the server including a deep learning (DL) module, the DL module including a deep learning (DL) model, a template searcher, and an affine modeler; identifying a real class and a real location of the real objects in the FOV with the DL model; locating a template box within the FOV with the template searcher, the template box located based on object matching with a template, the template including a plurality of ideal objects; and fitting a shift model and a rotation model with the affine modeler to a location difference between the plurality of ideal objects and the one or more real objects in the FOV.
10. The method according to example 9, wherein the lithography system further includes a lithography server, the lithography server operable to receive the image from each camera of the plurality of cameras.
11. The method according to example 10, wherein the plurality of image projection systems are in communication with an image projection computer, the image projection computer operable to send the image from each camera of the plurality of cameras to the lithography server.
12. The method according to example 11, wherein the image projection computer is operable to instruct the camera to capture the image in the FOV of each camera of the plurality of cameras.

13. The method according to example 9, wherein the one or more real objects correspond to a resulting pattern based on a mask pattern data, the resulting pattern formed in a photoresist by the processing unit.

14. The method according to example 13, further comprising altering a second mask pattern data corresponding to a second pattern according to the shift model and the rotation model, the second pattern patterned above the resulting pattern.

15. The method according to example 9, wherein the FOV of the camera is positioned to capture an alignment mark of the image.

16. The method according to example 9, wherein the FOV of the camera is positioned to capture a target feature of the image.

17. A method, comprising: capturing a plurality of ideal images of a mask pattern in a server, the server including a deep learning (DL) module, the DL module including a geometry processing software and a deep learning training engine, the plurality of ideal images including ideal objects; applying an algorithm to the plurality of ideal images with the geometry processing software to generate a plurality of generated images, the algorithm applying effects to the plurality of ideal images such that the generated images are different than the ideal images, the plurality of generated images including generated objects; creating a ground truth table with the geometry processing software, the ground truth table including an ideal class and an ideal location of the ideal objects; and producing an X shift value, a Y shift value, and a rotation value in the deep learning training model, the X shift value, the Y shift value, and the rotation value corresponding to a position difference between the generated objects compared to the ground truth table.

18. The method according to example 15, wherein the effects applied by the algorithm to the plurality of ideal images include shifts, rotations, noise, blurring, and illuminations.

19. A method, comprising: capturing a sample image in a field of view (FOV) of each camera of a plurality of cameras of a processing unit of a lithography system, the processing unit having a plurality of image projection systems, each image projection system of the plurality of image projection systems including at least one of each camera of the plurality of cameras, the sample image including one or more sample objects and one or more sample alignment marks; transferring the sample image in the FOV to a server in communication with the lithography system, the server including a deep learning (DL) module, the DL module including a geometry processing software and a deep learning training engine; identifying a positon of the one or more sample alignment marks with the geometry processing software; creating a ground truth table with the geometry processing software, the ground truth table including an ideal class and an ideal location of one or more ideal objects and the ideal location of one or more alignment marks; and producing an X shift value, a Y shift value, and a rotation value in the deep learning training model, the X shift value, the Y shift value, and the rotation value corresponding to a position difference between the sample alignment marks compared to the ground truth table.

20. The method according to example 19, wherein the lithography system further includes a lithography server, the lithography server operable to receive the sample image from each camera of the plurality of cameras.

21. The method according to example 20, wherein each image projection system of the plurality of image projection systems includes an image projection computer, the image projection computer operable to send the sample image from each camera of the plurality of cameras to the lithography server.

22. The method according to example 21, wherein the image projection computer is operable to instruct the camera to capture the sample image in the FOV of each camera of the plurality of cameras.

23. A non-transitory computer-readable medium storing instructions that, when executed by a processor, cause a computer system to perform the steps of: capturing an image in a field of view (FOV) of each camera of a plurality of cameras of a processing unit of a lithography system, the processing unit having a plurality of image projection systems, each image projection system of the plurality of image projection systems including at least one of each camera of the plurality of cameras, the image including one or more real objects; transferring the image in the FOV to a server in communication with the lithography system, the server including a deep learning (DL) module, the DL module including a deep learning (DL) model, a template searcher, and an affine modeler; identifying a real class and a real location of the real objects in the FOV with the DL model; locating a template box within the FOV with the template searcher, the template box located based on object matching with a template, the template including a plurality of ideal objects; and fitting a shift model and a rotation model with the affine modeler to a location difference between the plurality of ideal objects and the real objects within the FOV.

24. A non-transitory computer-readable medium storing instructions that, when executed by a processor, cause a computer system to perform the steps of: capturing a plurality of ideal images of a mask pattern in a server, the server including a deep learning (DL) module, the DL module including a geometry processing software and a deep learning training engine, the plurality of ideal images including ideal objects; applying an algorithm to the plurality of ideal images with the geometry processing software to generate a plurality of generated images, the algorithm applying effects to the plurality of ideal images such that the generated images are different than the ideal images, the plurality of generated images including generated objects; creating a ground truth table with the geometry processing software, the ground truth table including an ideal class and an ideal location of the ideal objects; and producing an X shift value, a Y shift value, and a rotation value in the deep learning training model, the X shift value, the Y shift value, and the rotation value corresponding to a position difference between the generated objects compared to the ground truth table.

25. A non-transitory computer-readable medium storing instructions that, when executed by a processor, cause a computer system to perform the steps of: capturing a sample image in a field of view (FOV) of each camera of a plurality of cameras of a processing unit of a lithography system, the processing unit having a plurality of image projection systems, each image projection system of the plurality of image projection systems including at least one of each camera of the plurality of cameras, the sample image including one or more sample objects and one or more sample alignment marks; transferring the sample image in the FOV to a server in communication with the lithography system, the server including a deep learning (DL) module, the DL module including a geometry processing software and a deep learning training engine; identifying a positon of the one or more sample alignment marks with the geometry processing software; creating a ground truth table with the geometry processing software, the ground truth table including an ideal class and an ideal location of one or more ideal objects and the ideal location of one or more alignment marks; and producing an X shift value, a Y shift value, and a rotation value in the deep learning training model, the X shift value, the Y shift value, and the rotation value corresponding to a position difference between the sample alignment marks compared to the ground truth table.

While the foregoing is directed to examples of the present disclosure, other and further examples of the disclosure may be devised without departing from the basic scope thereof, and the scope thereof is determined by the claims that follow.

What is claimed is:

1. A method, comprising:
capturing an image in a field of view (FOV) of each camera of a plurality of cameras of a processing unit of a lithography system, the processing unit having a plurality of image projection systems, each image projection system of the plurality of image projection systems including at least one of each camera of the plurality of cameras, the image including one or more real objects;
transferring the image in the FOV to a server in communication with the lithography system, the server including a deep learning (DL) module, the DL module including a deep learning (DL) model, a template searcher, and an affine modeler;
identifying a real class and a real location of the real objects in the FOV;
locating a template box within the FOV, the template box located based on object matching with a template, the template including a plurality of ideal objects; and
fitting a shift model and a rotation model to a location difference between the plurality of ideal objects and the one or more real objects in the FOV.

2. The method of claim 1, wherein the lithography system further includes a lithography server, the lithography server operable to receive the image from each camera of the plurality of cameras.

3. The method of claim 2, wherein the plurality of image projection systems are in communication with an image projection computer, the image projection computer operable to send the image from each camera of the plurality of cameras to the lithography server.

4. The method of claim 3, wherein the image projection computer is operable to instruct the camera to capture the image in the FOV of each camera of the plurality of cameras.

5. The method of claim 1, wherein the one or more real objects correspond to a resulting pattern based on a mask pattern data, the resulting pattern formed in a photoresist by the processing unit.

6. The method of claim 5, further comprising altering a second mask pattern data corresponding to a second pattern according to the shift model and the rotation model, the second pattern patterned above the resulting pattern.

7. The method of claim 1, wherein the FOV of the camera is positioned to capture an alignment mark of the image.

8. The method of claim 1, wherein the FOV of the camera is positioned to capture a target feature of the image.

9. The method of claim 1, wherein the DL model is operable to identify the real class and the real location of the real objects in the FOV.

10. The method of claim 1, wherein the template searcher is operable to locate the template box within the FOV.

11. The method of claim 1, wherein the affine modeler is operable to fit the shift model and the rotation model.

12. A method, comprising:
capturing a sample image in a field of view (FOV) of each camera of a plurality of cameras of a processing unit of a lithography system, the processing unit having a plurality of image projection systems, each image projection system of the plurality of image projection systems including at least one of each camera of the plurality of cameras, the sample image including one or more sample objects and one or more sample alignment marks;
transferring the sample image in the FOV to a server in communication with the lithography system, the server including a deep learning (DL) module, the DL module including a geometry processing software and a deep learning training engine;
identifying a position of the one or more sample alignment marks with the geometry processing software;
creating a ground truth table with the geometry processing software, the ground truth table including an ideal class and an ideal location of one or more ideal objects and of one or more alignment marks; and
producing an X shift value, a Y shift value, and a rotation value in the deep learning training model, the X shift value, the Y shift value, and the rotation value corresponding to a position difference between the sample alignment marks compared to the ground truth table.

13. The method of claim 12, wherein the lithography system further includes a lithography server, the lithography server operable to receive the sample image from each camera of the plurality of cameras.

14. The method of claim 13, wherein each image projection system of the plurality of image projection systems includes an image projection computer, the image projection computer operable to send the sample image from each camera of the plurality of cameras to the lithography server.

15. The method of claim 14, wherein the image projection computer is operable to instruct the camera to capture the sample image in the FOV of each camera of the plurality of cameras.

16. A non-transitory computer-readable medium storing instructions that, when executed by a processor, cause a computer system to perform the steps of:
capturing an image in a field of view (FOV) of each camera of a plurality of cameras of a processing unit of a lithography system, the processing unit having a plurality of image projection systems, each image projection system of the plurality of image projection systems including at least one of each camera of the plurality of cameras, the image including one or more real objects;
transferring the image in the FOV to a server in communication with the lithography system, the server including a deep learning (DL) module, the DL module including a deep learning (DL) model, a template searcher, and an affine modeler;

identifying a real class and a real location of the real objects in the FOV;

locating a template box within the FOV, the template box located based on object matching with a template, the template including a plurality of ideal objects; and fitting a shift model and a rotation model to a location difference between the plurality of ideal objects and the real objects within the FOV.

17. The non-transitory computer-readable medium of claim 16, wherein the lithography system further includes a lithography server, the lithography server operable to receive the image from each camera of the plurality of cameras.

18. The non-transitory computer-readable medium of claim 17, wherein each image projection system of the plurality of image projection systems includes an image projection computer, the image projection computer operable to send the image from each camera of the plurality of cameras to the lithography server.

19. The non-transitory computer-readable medium of claim 18, wherein the image projection computer is operable to instruct the camera to capture the image in the FOV of each camera of the plurality of cameras.

20. The non-transitory computer-readable medium of claim 16, wherein the one or more real objects correspond to a resulting pattern based on a mask pattern data, the resulting pattern formed in a photoresist by the processing unit.

* * * * *